United States Patent [19]

Osada

[11] Patent Number: 4,862,586
[45] Date of Patent: Sep. 5, 1989

[54] LEAD FRAME FOR ENCLOSING SEMICONDUCTOR CHIPS WITH RESIN

[76] Inventor: Michio Osada, No. 6-197, 3-chome, Myojyo-cho, Uji-shi, Kyoto-fu, Japan

[21] Appl. No.: 154,539

[22] Filed: Feb. 5, 1988

Related U.S. Application Data

[63] Continuation of Ser. No. 833,136, Feb. 26, 1986, abandoned.

[30] Foreign Application Priority Data

Feb. 28, 1985 [JP] Japan ............................ 60-29569[U]
Feb. 28, 1985 [JP] Japan ............................ 60-29570[U]
Mar. 28, 1985 [JP] Japan ............................ 60-46306[U]
Jul. 6, 1985 [JP] Japan ............................ 60-86159[U]

[51] Int. Cl.⁴ ...................... H01L 23/30; B29C 45/14
[52] U.S. Cl. ....................................... 29/827; 29/841; 264/272.13; 264/272.17; 264/328.9; 425/806; 425/812
[58] Field of Search ...................... 264/272.13, 272.17, 264/328.9, 161; 425/806, 812; 29/841, 832, 827, 588; 428/596, 620, 624, 625, 626, 600, 687; 174/52 FP; 357/72, 70, 69

[56] References Cited

U.S. PATENT DOCUMENTS

| | | | |
|---|---|---|---|
| 3,932,685 | 1/1976 | Flowers | 427/352 |
| 4,132,856 | 1/1979 | Hutchinson et al. | 357/72 |
| 4,151,543 | 4/1979 | Hayakawa et al. | 357/72 |
| 4,504,435 | 3/1985 | Orcott | 264/328.9 |
| 4,548,574 | 10/1985 | Badalamenti | 264/161 |
| 4,592,131 | 6/1986 | Deie | 264/161 |
| 4,741,507 | 5/1988 | Baird | 264/272.17 |

FOREIGN PATENT DOCUMENTS

| | | | |
|---|---|---|---|
| 130552 | 1/1985 | European Pat. Off. | 357/72 |
| 43366 | 4/1977 | Japan | 264/272.17 |
| 124075 | 10/1978 | Japan | 29/588 |
| 101264 | 8/1979 | Japan | 357/72 |
| 101265 | 8/1979 | Japan | 357/70 |
| 148479 | 11/1979 | Japan | 357/72 |
| 152970 | 12/1979 | Japan | 357/70 |
| 3928 | 1/1980 | Japan | 264/161 |
| 46537 | 4/1980 | Japan | 264/328.9 |
| 18604 | 5/1980 | Japan | 264/272.12 |
| 83053 | 7/1981 | Japan | 29/841 |
| 27352 | 2/1983 | Japan | 357/70 |
| 54659 | 3/1983 | Japan | 357/72 |
| 64056 | 4/1983 | Japan | 357/72 |
| 127356 | 7/1983 | Japan | 29/841 |
| 29442 | 2/1984 | Japan | 357/70 |
| 104147 | 6/1984 | Japan | 357/72 |
| 150459 | 8/1984 | Japan | 357/70 |
| 177952 | 10/1984 | Japan | 357/72 |
| 182729 | 9/1985 | Japan | 29/588 |
| 1004234 | 1/1986 | Japan | 264/272.17 |
| 2173726 | 7/1987 | Japan | 264/161 |

*Primary Examiner*—John J. Zimmerman
*Attorney, Agent, or Firm*—Larson and Taylor

[57] ABSTRACT

A lead frame for enclosing a semiconductor chip with resin has a plurality of leads and at least one side frame member for supporting the leads. The lead frame is formed at a required location with a resin adhering portion for effectively removing resin and fins solidified in the air vent of a molding apparatus and formed between the lead frame and the dies of the apparatus.

6 Claims, 4 Drawing Sheets

LEAD FRAME FOR ENCLOSING SEMICONDUCTOR CHIPS WITH RESIN

This application is a continuation of application Ser. No. 833,136 filed Feb. 26, 1986, now abandoned.

BACKGROUND OF THE INVENTION

Enclosing semiconductor chips with a resin material by transfer molding is well known.

With reference to FIG. 11 showing this process, a lead frame D for semiconductor chips G is set in a cavity C formed between an upper die A and a lower die B. A molten resin material E is then injected into the cavity C through a gate F to enclose the chips G on the lead frame D with the resin filling the cavity C.

An air vent H is provided in the plane of a parting line PL between the upper and lower dies A and B for the cavity C to communicate with the outside therethrough. Accordingly, the air I within the cavity C is forced out through the air vent H by the molten resin material E injected into the cavity C.

The air I is thus completely discharged from the cavity C through the air vent H so that the surface or interior of the resin body molded in the cavity C will be free of voids that would be formed if some air remains in the cavity C. The presence of the air vent H is therefore one of the requirements for producing resin-enclosed semiconductor chips which must be highly resistant to moisture and reliable.

The air I is discharged through the air vent H by being forced out by the molten resin material E injected into the cavity C, with the result that a portion of the resin material E fills the air vent H to create the following objections.

Since the air vent H is provided by a clearance formed in the plane of the parting line PL, the resin material solidified in the air vent H is liable to adhere to and remain on the opposed surfaces of the dies A and B to impair the function of the air vent. Further in the case where the molding apparatus is large-sized, an air vent is formed in the surface of each of the upper and lower dies, so that the solidified resin is difficult to remove. Consequently, the dies are used for the subsequent molding operation without completely removing the solid resin from the air vents. If the air vent H is completely or partly closed with the solid resin, it becomes impossible or difficult to discharge air from the cavity C, permitting some air to remain in the cavity C. It is then impossible to completely prevent formation of voids in the surface or interior of the molded resin body.

The surfaces of the dies A and B are usually cleaned manually for the removal of solid resin. The cleaning operation requires a cumbersome procedure if it is to be conducted completely. Further the cleaning operation, which needs to be conducted on completion of every molding cycle, results in a greatly reduced molding operation efficiency. Further because the cleaning operation is conducted with the two dies A and B moved away from each other upward and downward, the operation is hazardous, and the time-consuming cleaning work is not desirable in assuring the operator of safety.

SUMMARY OF THE INVENTION

The present invention relates to improvements in lead frames for use in enclosing semiconductor chips with resin.

The main object of the present invention is to provide a lead frame for enclosing semiconductor chips with resin whereby the solid resin formed in the air vent between two dies can be removed when the resin-enclosed product and the lead frame are removed from the dies after molding operation.

Another object of the present invention is to provide a lead frame for enclosing semiconductor chips by which fins formed between the tie bar surfaces and the opposed die surfaces can be removed when the resin-enclosed product and the lead frame are removed from the die surfaces.

The present invention provides a lead frame for enclosing semiconductor chips with resin, the lead frame comprising a plurality of leads, at least one side frame member for supporting the leads, and when required, a tie bar and other members, the lead frame being especially formed with at least one adhering portion at a required location.

According to the invention, the resin adhering portion is formed on the frame member and/or the tie bar of the lead frame on the surface thereof at a required portion or required portions.

Further according to the invention, the resin adhering portion is rough-surfaced.

Further according to the invention, a suitable number of grooves provide the resin adhering portion.

The grooves form a desired device, symbol or pattern.

When the lead frame of the above construction is used for enclosing a semiconductor chip thereon with resin, solidified resin formed in the air vent between two dies and a fin formed between the lead frame surface and the opposed surfaces of the dies along the parting line lodge on the resin adhering portion of the lead frame. Accordingly the solidified resin and the fin lodging on the adhering portion are removed along with the lead frame when the lead frame and the resin-enclosed product are removed from the dies.

According to the present invention, therefore, the solidified resin and fins are reliably prevented from remaining in the air vent or on the opposed surfaces of the dies after every molding cycle to always fulfill the important molding requirement that the air vent should be kept open. The resin-enclosed semiconductor product obtained is accordingly free from voids in its surface or interior and has high quality, high resistance to moisture and outstanding reliability. Moreover, the opposed die surfaces can be cleaned easily and effectively. This greatly improves the molding efficiency, shortens the time required for cleaning and therefore eliminates the hazard involved in the work.

BRIEF DESCRIPTION OF THE DRAWINGS

FIG. 10 is an enlarged perspective view partly broken away and showing a lead frame to illustrate an example of resin adhering portion; and FIG. 11 is a view showing a molding operation for enclosing a semiconductor chip with resin using a conventional lead frame;

DESCRIPTION OF THE PREFERRED EMBODIMENTS

Figure 1:
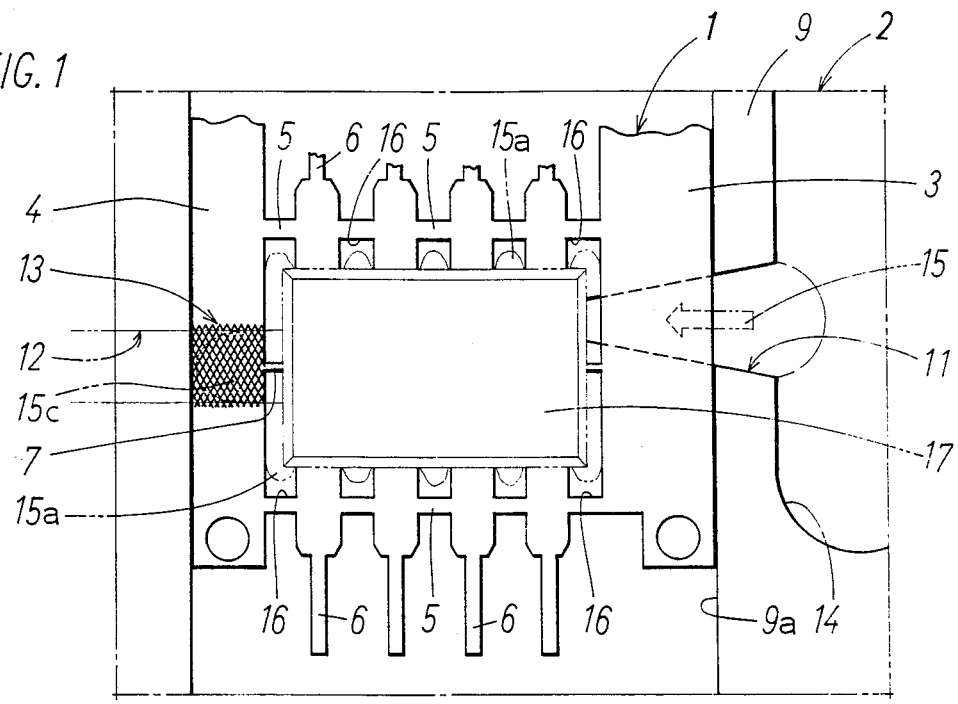
FIG. 1 is a plan view partly broken away and showing part of a lower die and a lead frame embodying the invention after a semiconductor chip thereon has been enclosed with resin.
Figure 2:
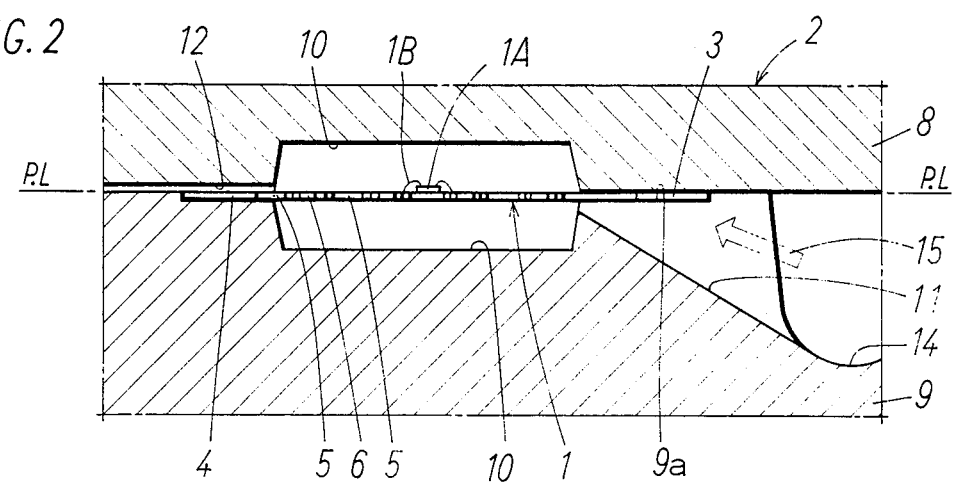
FIG. 2 is a view in vertical section showing the lead frame as set in position between upper and lower dies.

FIGS. 1 and 2 show a lead frame 1 of the invention for enclosing a semiconductor chip with resin and part of a molding apparatus 2 for enclosing the chip 1A on the lead frame 1.

The lead frame 1 of the invention comprises two elongated side frame members 3, 4 spaced apart by a required distance and extending in parallel with each other, a plurality of leads 6 arranged between the side frame members 3, 4 in parallel therewith and interconnected at a spacing by a plurality of tie bars 5 extending between the side frames at right angles therewith, and tab leads 7 for positioning the chip 1A in place.

When the lead frame 1 is set in position between upper and lower dies 8, 9 of the molding apparatus 2, i.e., when the frame 1 is set as specified in a setting groove 9a formed in the parting line (PL) surface of the lower die 9, the semiconductor chip 1A is positioned within a molding cavity 10 provided by the upper and lower dies. At this time, the side frame member 3 of the lead frame is positioned toward one side of the apparatus 2 where a gate 11 is provided, while the other side frame member 4 is positioned toward the other side where the apparatus has an air vent 12.

The side frame member 4 positioned toward the air vent 12 has on its upper surface a resin adhering rough-surfaced portion 13 for causing a portion of resin material filling the air vent 12 to adhere to the surface of the frame member 4.

The lead frame 1 thus constructed is used in the following manner for enclosing the chip 1A with resin.

First, the lead frame 1 is set in position between the upper and lower dies 8, 9 as seen in FIG. 2. Thus, the frame 1 is intimately fitted in the setting groove 9a in the lower die 9 along the plane of parting line PL between the two dies 8, 9. Subsequently in this state, a molten resin material 15 is injected into the cavity 10 through a runner 14 and the gate 11 of the molding apparatus 2. The molten resin material 15 injected into the cavity 10 fills the cavity while forcing out air from the cavity. The resin material 15 is injected until the material partly flows into the spaces defined or provided by dam portions 16 around the cavity 10, i.e., the side frame members 3, 4, the leads 6, the die bars 5, tab leads 7 and the thickness of the lead frame 1 as shown in FIG. 1. When the material 15 is thus injected, the air within the cavity 10 is forced out from the cavity 10 via the dam portions 16 and the air vent 12. When the material is caused to flow into spaces defined by the dam portions 16, the material is also caused to fill the air vent 12 at the same time to properly discharge the air from the cavity 10.

After the molding operation thus conducted, the lead frame 1 is removed from between the two dies 8 and 9.

Figure 3:
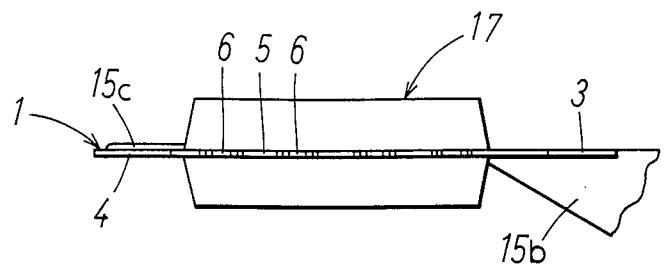
FIG. 3 is a front view partly broken away and showing the lead frame, resin-enclosed molded body and solidified resin adhering to the frame.
Figure 4:
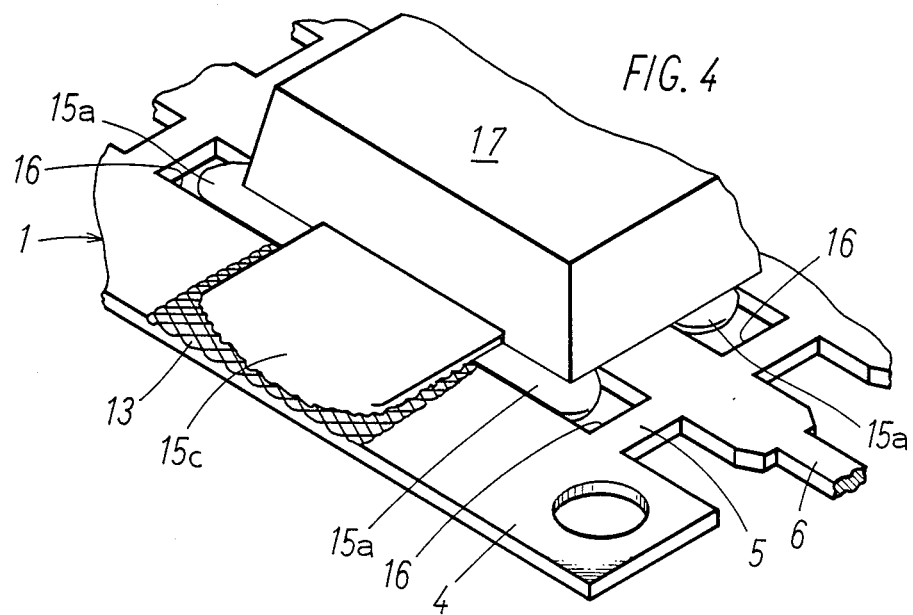
FIGS. 4 and 5 are an enlarged perspective view and an enlarged end view both partly broken away and showing the solidified resin adhering to a side frame member.
Figure 5:
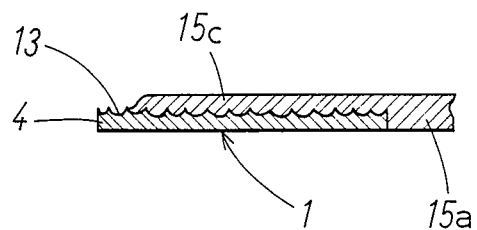

FIGS. 3 to 5 show the lead frame 1 which has integrally adhered thereto a molded resin body 17 having the chip 1A enclosed therein, resin portions 15a flowing out into the spaces defined by the dam portions 16 and solidified, a resin portion 15b solidified in the runner 14 and the gate 11, and a solidified resin portion 15c filling the air vent 12 and adhering to the adhering portion 13 of the side frame member 4. The solid resin 15c adhering to the portion 13 of the member 4 is especially firmly bonded to the member 4. This prevents the solid resin portion 15c from separating from the side frame member 4 and remaining in the air vent 12 of the apparatus 2 when the lead frame 1 is removed.

The lead frame 1 is then removed and has its side frame members 3, 4, tie bars 5 and tab leads 7 cut off except for the molded body 17 and the leads 6. The leads 6 are bent through a specified angle. Thus, a resin-enclosed semiconductor product is obtained.

The lead frame 1 of the invention may be modified, for example, as will be described below although not shown.

When the upper and lower dies 8, 9 of the apparatus each have an air vent 12, the resin adhering portion 13 is provided on each of the upper and lower (front and rear) surfaces of the frame member 4 in corresponding relation to the position of the vent.

The adhering portion 13 may be formed over the entire area of the surface of the frame member 4 to be opposed to the air vent 12, or over the entire front and rear surfaces of the frame member 4. This leads to the advantage of eliminating the need to match the adhering portion 13 to the air vent in position when the lead frame is to be used for various types of moding apparatus.

The resin adhering portion 13 may be formed not only on the side frame member 4 toward the air vent 12 but also on the entire front and rear surfaces of the side frame member 3 except where the member 3 is opposed to the gate 11. In this case, the following advantages are obtained.

When the lead frame 1 removed from between the upper and lower dies 8, 9 is to be transferred to the tie bar cutting process and bending process, it is likely that the solid resin portion 15b corresponding to the gate 11 and adhering to the frame 1 will be removed to assure smooth transfer. The resin portion 15b corresponding to the gate 11 is adhering to the frame member 3 in the usual state and is therefore easy to remove before transfer. Further the molten resin material 15 is likely to ingress into the spaces between the upper and lower die surfaces and the upper and lower surfaces of the side frame member 3 except in the portion thereof opposed to the gate 11. In such a case, the resin can be firmly bonded to the frame member 3 upon solidification so as to remove the resulting fins from the surfaces of the dies 8, 9. For molding operation, the upper and lower dies 8, 9 are clamped with the lead frame 1 held thereby along the parting line PL. Further the leads 6 need to be clamped accurately. For these reasons, a small clearance is more likely to occur between the frame members 3, 4 and the opposed surfaces of the dies 8, 9 than between the leads 6 and the dies. When such clearances occur, the molten resin material 15 partly ingresses into the spaces between the dies 8, 9 and the frame members 3, 4 and solidifies. However, the resulting fins, which are firmly bonded to the adhering portions 13 of the frame members 3, 4, can be removed from the dies 8, 9, hence advantageous.

Figure 6:
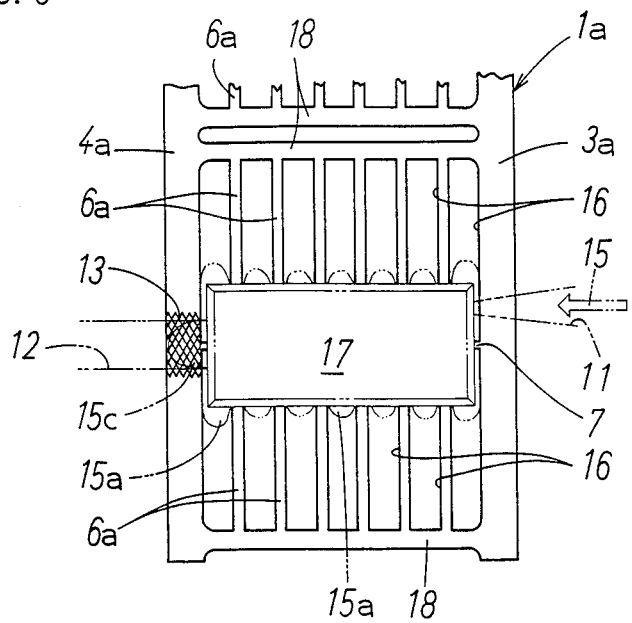
FIGS. 6 to 9 show other embodiments and are plan views partly broken away an each showing a lead frame and part of lower die after molding operation.

The structures of the foregoing embodiments can be applied to a semiconductor lead frame 1a shown in FIG. 6. The lead frame 1a comprises two side frame members 3a, 4a which are interconnected by a plurality of connectors 18. The ends of a plurality of leads 6a are joined to each connector 18. The present invention as embodied for such frame has the same effect and advantages as already stated.

Figure 7:
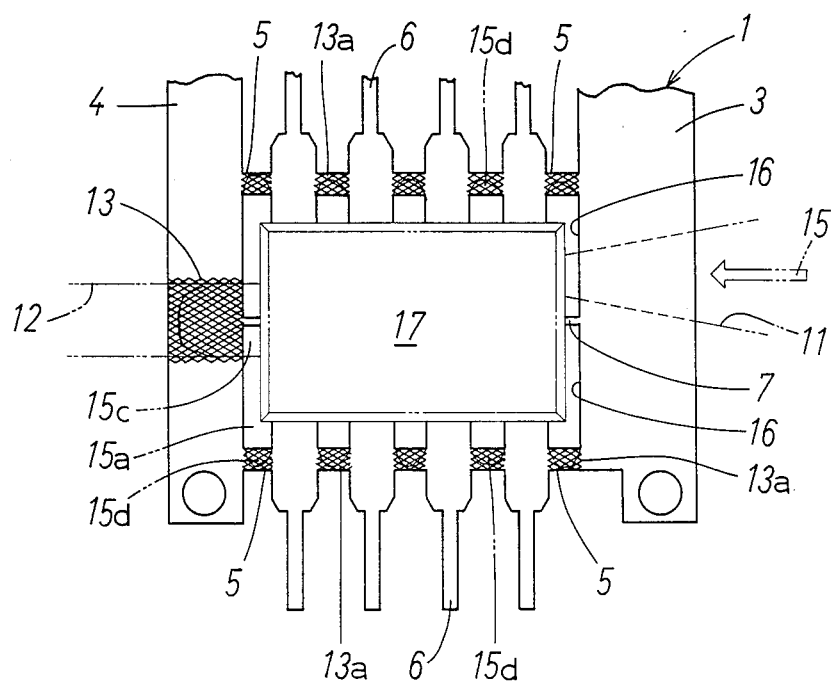
Figure 8:
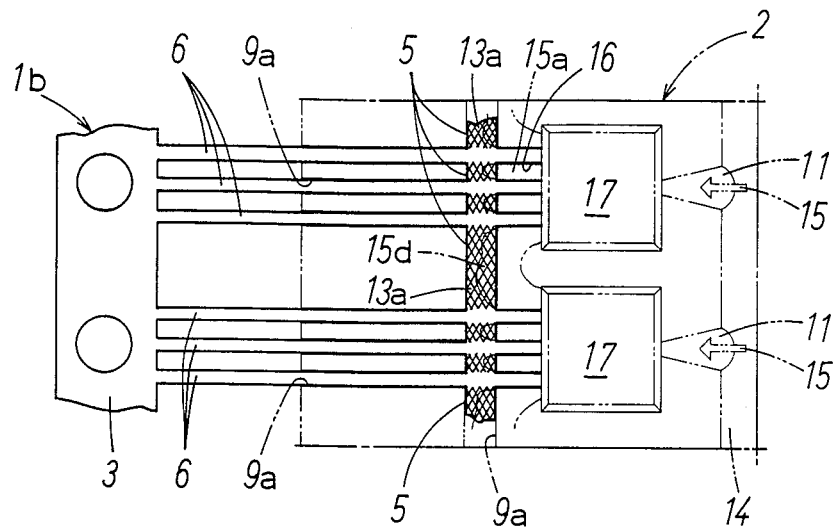
Figure 9:
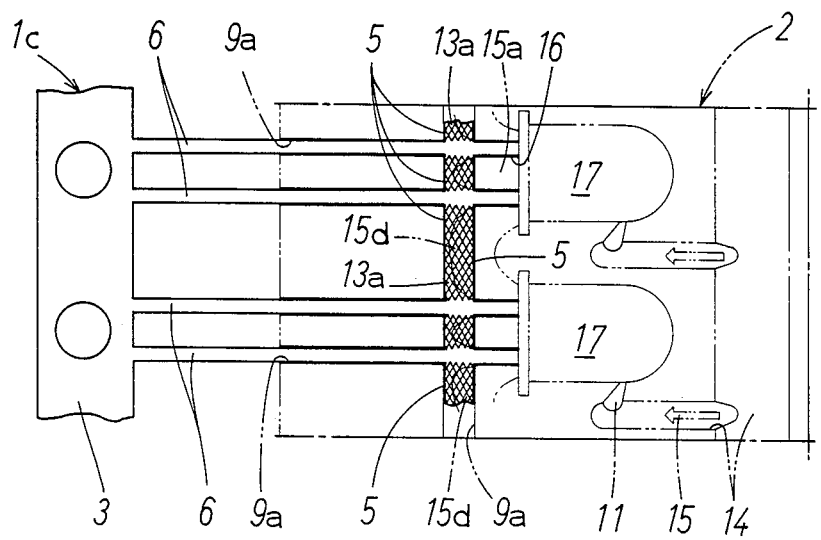

Besides the foregoing embodiments, the resin adhering portion 13a may be formed on one surface of each tie bar 5 of a lead frame 1, or on both surfaces of each tie bar 5, partly or entirely as seen in FIGS. 7 to 9. Stated more specifically, FIG. 7 shows a lead frame 1 in which adhering portions 13, 13a are formed on a frame member 4 and each tie bar 5, respectively. FIGS. 8 and 9 show a transistor lead frame 1b and a light-emitting diode lead frame 1c, respectively, in which an adhering portion 13a is provided on each tie bar 5. When these lead frames are used, solidified resin 15c and fins 15d on the adhering portions 13, 13a can be firmly bonded to these portions. The molding apparatus 2 shown in FIGS. 8 and 9 have substantially the same construction as the one shown in FIGS. 1 and 2, so that throughout these drawings, like parts are designated by like reference numerals.

The adhering portions 13, 13a of the foregoing embodiments are rough-surfaced, for example, by knurling. However, such adhering portions may be shaped variously insofar as the resin material can be bonded to these portions effectively.

FIG. 10 shows another example of resin adhering portion 13b which is adapted to exhibit an improved adhering effect. Grooves 19 of specified width and depth provide the adhering portion 13b. The grooves 19 may be in the form of a device, symbol, pattern or the like for identifying the manufacturer or sales agent of the lead frame 1.

Although the present invention has been described with reference to the preferred embodiments, these embodiments are given for illustrative purposes only, and the invention is not limited thereto. Various modifications are therefore included in the scope of the invention unless they depart from the scope as defined in the appended claims.

What is claimed is:

1. An improved method of removing resin from an air vent for a cavity provided between two dies of the type in which a semiconductor chip is located on a lead frame having a portion of the lead frame disposed adjacent the air vent and the semiconductor chip is enclosed in resin by injection of a liquid resin into the cavity and air vent, the improvement comprising the steps of:

initially forming a resin adhering surface on at least the portion of the lead frame;

adhering the resin to the resin adhering surface during the enclosing of the semiconductor chip; and subsequently removing the solidified resin in the air vent with the lead frame as the resin preferentially adheres to the resin adhering surface of the lead frame.

2. An improved method of removing resin as claimed in claim 1 wherein said forming step includes the step of forming at least one groove in the portion.

3. An improved method of removing resin as claimed in claim 1 wherein said forming step includes the roughening of the portion.

4. An improved method of removing resin as claimed in claim 1 wherein the lead frame includes front and rear surfaces including a gate area adjacent a gate of the die through which the resin is introduced into the cavity, and wherein said forming step includes the forming of a resin adhering surface on all of the front and surfaces of the lead frame except for the gate area.

5. An improved method of removing resin as claimed in claim 1 wherein the lead frame includes a plurality of leads and a pair of side frame members for supporting the leads, and wherein said forming step includes the forming of the resin adhering surface on the entire surface of one of the side frame members.

6. An improved method of removing resin as claimed in claim 5 wherein the lead frame includes tie bars connecting adjacent leads and side frame members, and wherein the forming step includes the forming of resin adhering surfaces on each of the tie bars.

* * * * *